United States Patent
Yamaha et al.

(10) Patent No.: US 10,790,296 B1
(45) Date of Patent: Sep. 29, 2020

(54) DISTORTION-COMPENSATED WAFER BONDING METHOD AND APPARATUS USING A TEMPERATURE-CONTROLLED BACKSIDE THERMAL EXPANSION LAYER

(71) Applicant: SANDISK TECHNOLOGIES LLC, Addison, TX (US)

(72) Inventors: Takashi Yamaha, Obu (JP); Katsuya Kato, Yokkaichi (JP); Kazuto Watanabe, Nagoya (JP); Hajime Yamamoto, Nagoya (JP); Michiaki Sano, Ichinomiya (JP); Koichi Ito, Yokkaichi (JP); Ikue Yokomizo, Nagoya (JP); Ryo Hiramatsu, Yokkaichi (JP); Hiroshi Sasaki, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/417,913

(22) Filed: May 21, 2019

(51) Int. Cl.
*H01L 29/792* (2006.01)
*H01L 27/11578* (2017.01)
(Continued)

(52) U.S. Cl.
CPC .... *H01L 27/11578* (2013.01); *H01L 27/1157* (2013.01); *H01L 27/11521* (2013.01); *H01L 27/11529* (2013.01); *H01L 27/11551* (2013.01)

(58) Field of Classification Search
CPC ........ H01L 27/11578; H01L 27/11551; H01L 27/1157; H01L 27/11529; H01L 27/11521
See application file for complete search history.

(56) References Cited

U.S. PATENT DOCUMENTS 7,169,685 B2   1/2007   Connell et al.
8,927,335 B2   1/2015   Wimplinger
(Continued)

FOREIGN PATENT DOCUMENTS

EP    1702357 B1    6/2008
WO    WO2017106788 A1    6/2017

OTHER PUBLICATIONS

Endoh et al., titled "Novel Ultra High Density Memory With a Stacked-Surrounding Gate Transistor (S-SGT) Structured Cell", IEDM Proc. (2001) pp. 33-36.
(Continued)

*Primary Examiner* — Allen L Parker
*Assistant Examiner* — Wasiul Haider
(74) *Attorney, Agent, or Firm* — The Marbury Law Group, PLLC

(57) ABSTRACT

A bonded structure may be formed by measuring die areas of first semiconductor dies on a wafer at a measurement temperature, generating a two-dimensional map of local target temperatures that are estimated to thermally adjust a die area of each of the first semiconductor dies to a target die area, loading the wafer to a bonding apparatus comprising at least one temperature sensor, and iteratively bonding a plurality of second semiconductor dies to a respective one of the first semiconductor dies by sequentially adjusting a temperature of the wafer to a local target temperature of a respective first semiconductor die that is bonded to a respective one of the second semiconductor dies. An apparatus for forming such a bonded structure may include a computer, a chuck for holding the wafer, a die attachment unit, and a temperature control mechanism.

20 Claims, 13 Drawing Sheets

(51) Int. Cl.
*H01L 27/1157* (2017.01)
*H01L 27/11521* (2017.01)
*H01L 27/11529* (2017.01)
*H01L 27/11551* (2017.01)

(56) References Cited

U.S. PATENT DOCUMENTS

| | | | |
|---|---|---|---|
| 9,343,358 B1 | 5/2016 | Xu | |
| 10,115,681 B1 | 10/2018 | Ariyoshi | |
| 10,283,493 B1 | 5/2019 | Nishida | |
| 2005/0101082 A1* | 5/2005 | Yokoyama | C04B 35/565 438/232 |
| 2008/0188036 A1* | 8/2008 | La Tulipe | H01L 21/67092 438/107 |
| 2018/0374865 A1 | 12/2018 | Shimabukuro et al. | |

OTHER PUBLICATIONS

U.S. Appl. No. 15/960,267, filed Apr. 23, 2018, SanDisk Technologies LLC.
U.S. Appl. No. 16/284,502, filed Feb. 25, 2019, SanDisk Technologies LLC.
U.S. Appl. No. 16/278,372, filed Feb. 18, 2019, SanDisk Technologies LLC.
U.S. Appl. No. 16/295,292, filed Mar. 7, 2019, SanDisk Technologies LLC.
U.S. Appl. No. 16/243,469, filed Jan. 9, 2019, SanDisk Technologies LLC.
U.S. Appl. No. 15/892,648, filed Feb. 9, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.
U.S. Appl. No. 15/979,885, filed May 15, 2018, SanDisk Technologies LLC.
U.S. Appl. No. 16/248,923, filed Jan. 16, 2019, SanDisk Technologies LLC.
U.S. Appl. No. 16/231,752, filed Dec. 24, 2018, SanDisk Technologies LLC.
U.S. Appl. No. 16/274,687, filed Feb. 13, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/242,216, filed Jan. 8, 2019, SanDisk Technologies LLC.
U.S. Appl. No. 16/255,413, filed Jan. 23, 2019, SanDisk Technologies LLC.
U.S. Appl. No. 16/263,058, filed Jan. 31, 2019, SanDisk Technologies LLC.
U.S. Appl. No. 16/263,086, filed Jan. 31, 2019, SanDisk Technologies LLC.
U.S. Appl. No. 16/269,301, filed Feb. 6, 2019, SanDisk Technologies LLC.
U.S. Appl. No. 16/275,668, filed Feb. 14, 2019, SanDisk Technologies LLC.
U.S. Appl. No. 16/288,656, filed Feb. 28, 2019, SanDisk Technologies LLC.
Notification of Transmittal of the International Search Report and Written Opinion of the International Search Authority for International Patent Application No. PCT/US2019/068870, dated Mar. 30, 2020, 12 pages.

* cited by examiner

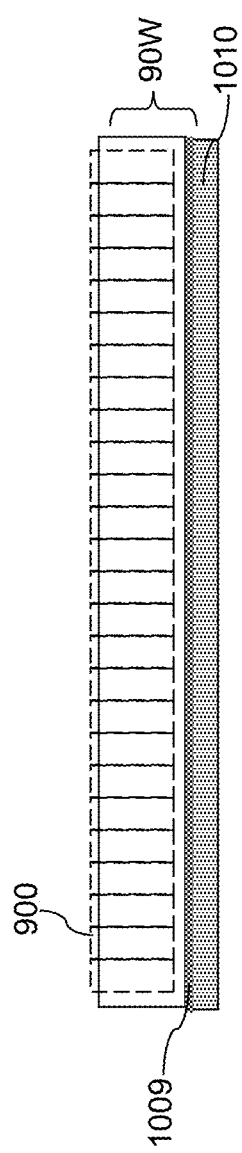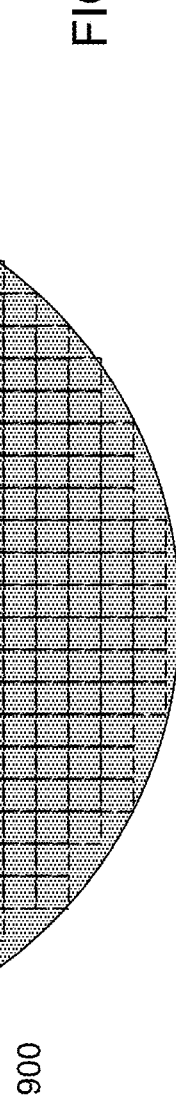

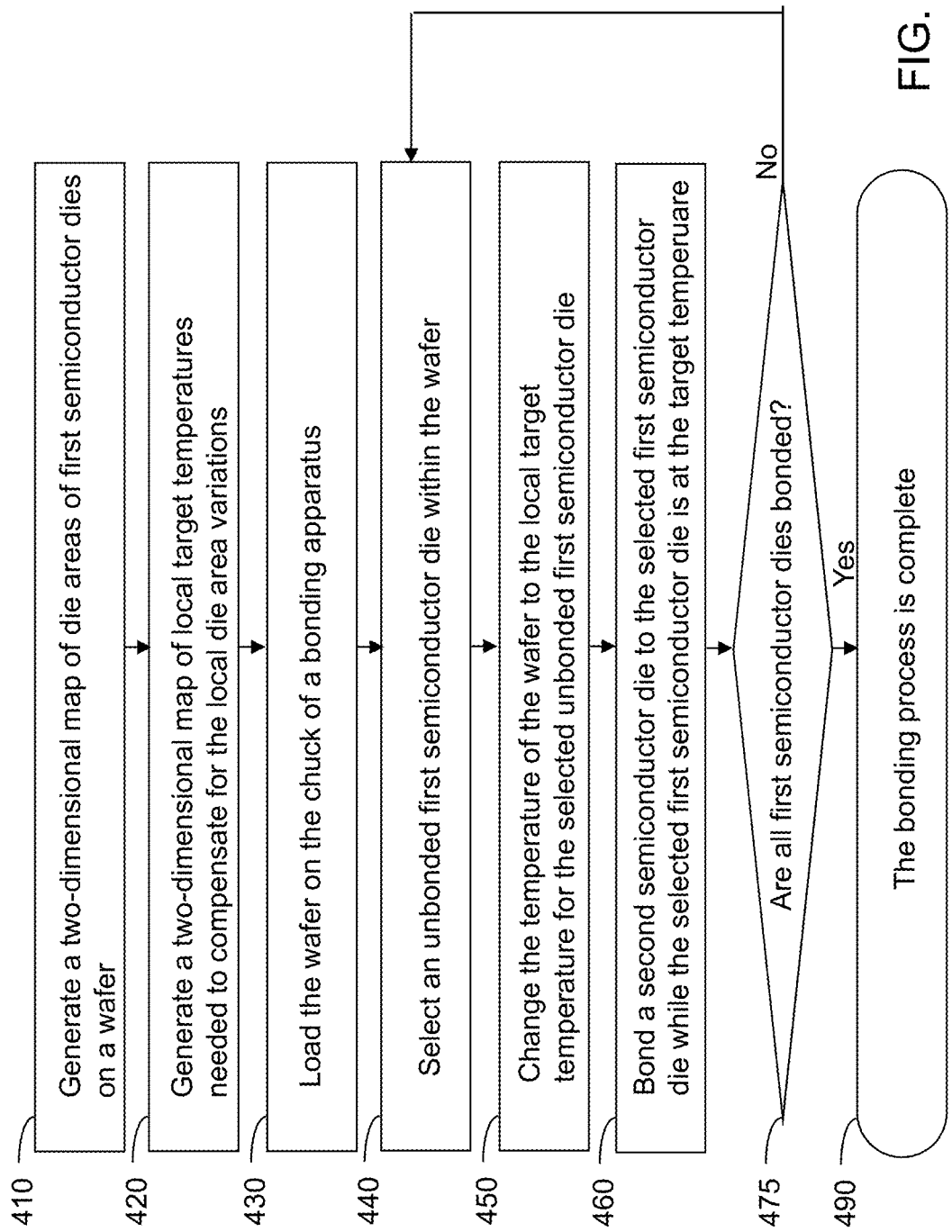

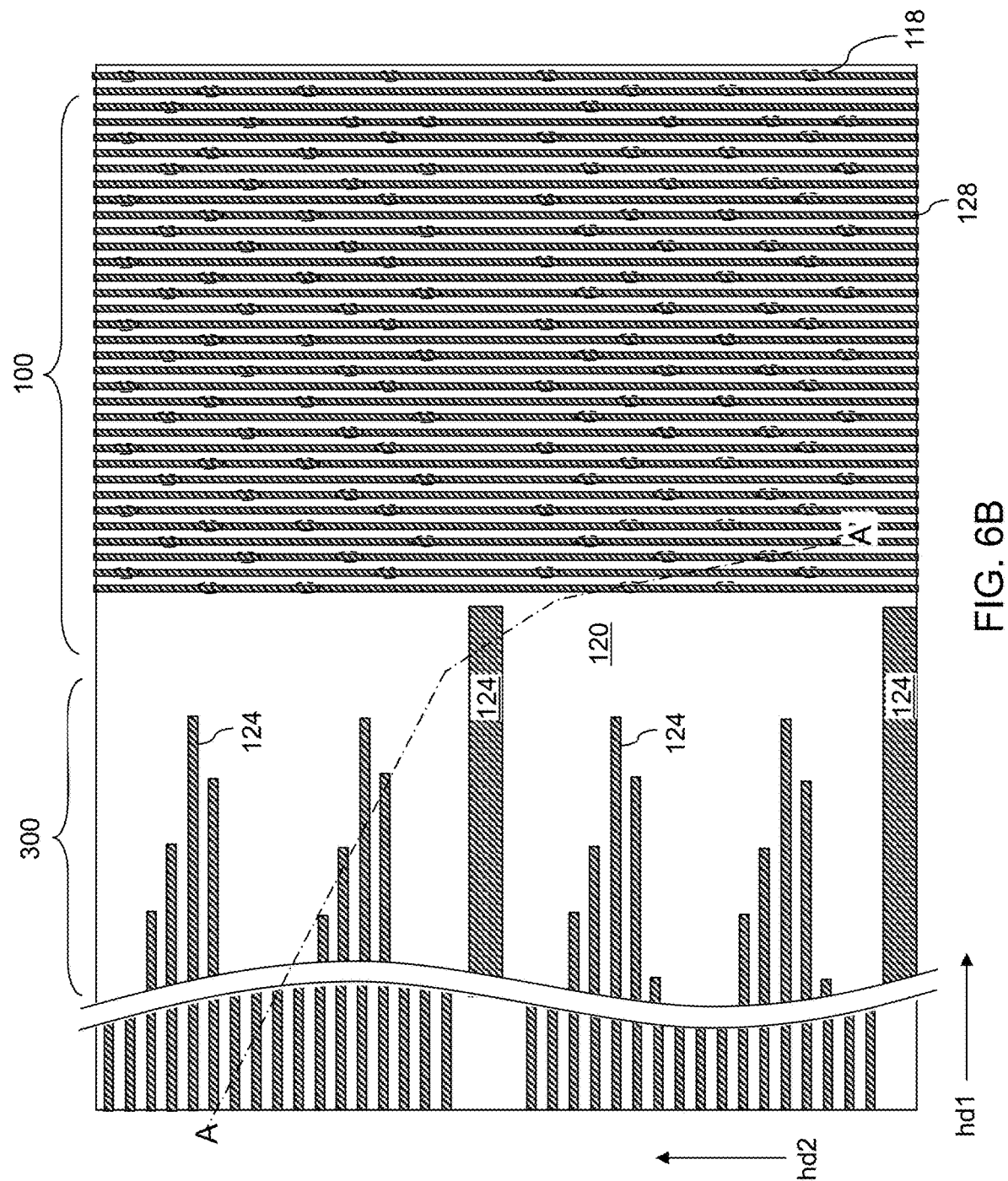

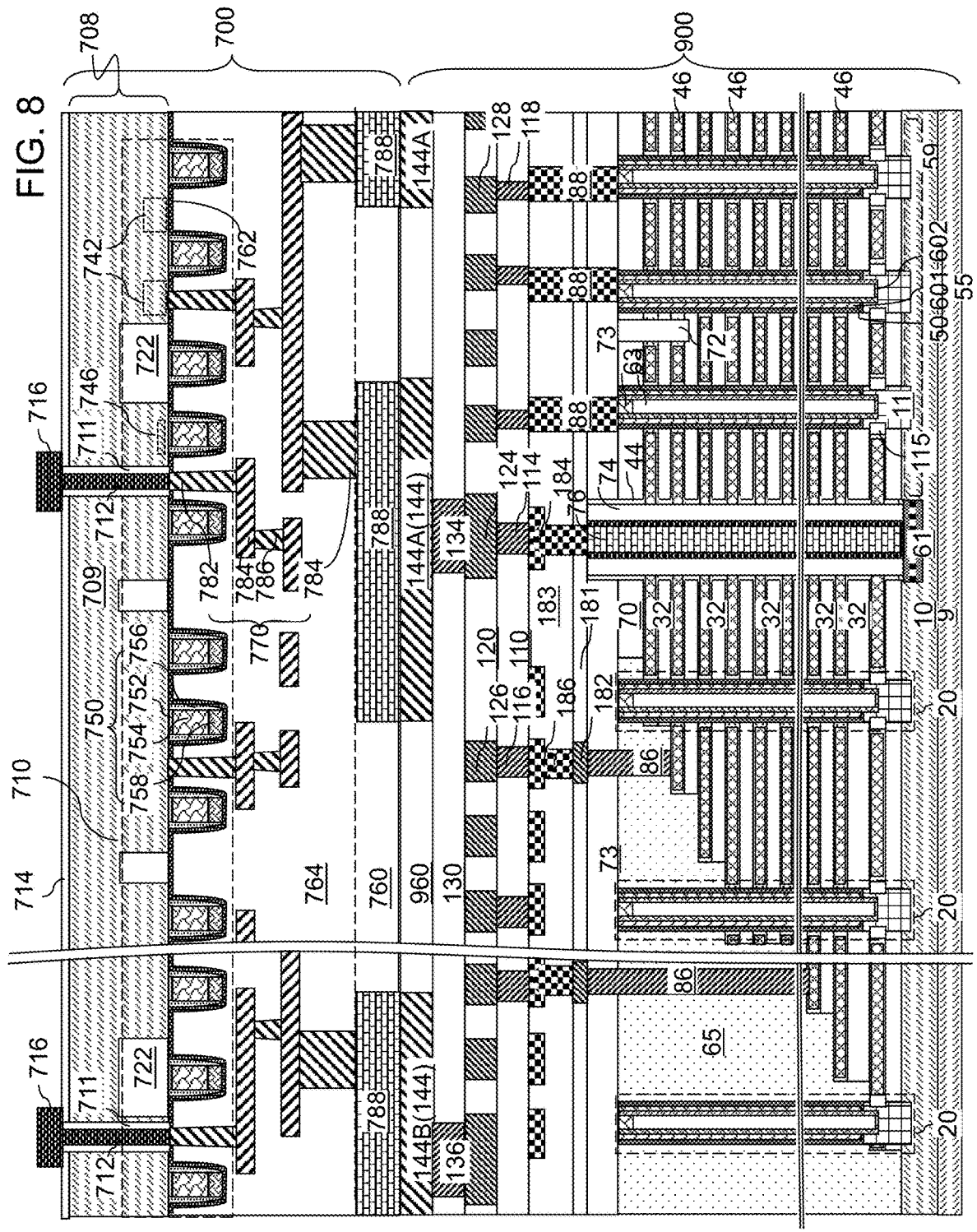

DISTORTION-COMPENSATED WAFER BONDING METHOD AND APPARATUS USING A TEMPERATURE-CONTROLLED BACKSIDE THERMAL EXPANSION LAYER

FIELD

The present disclosure relates generally to the field of semiconductor devices, and particularly to a warpage-compensating die bonding method and an apparatus for implementing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a method of forming a bonded structure is provided, which comprises: determining die areas of first semiconductor dies on a wafer at a measurement temperature; generating a two-dimensional map of local target temperatures that are estimated to thermally adjust a die area of each of the first semiconductor dies to a target die area; loading the wafer to a bonding apparatus comprising at least one temperature sensor; and iteratively bonding a plurality of second semiconductor dies to a respective one of the first semiconductor dies by sequentially adjusting a temperature of the wafer to a local target temperature of a respective first semiconductor die that is bonded to a respective one of the second semiconductor dies.

According to another embodiment of the present disclosure, a method of forming a bonded structure includes providing a wafer containing first semiconductor dies on a front side of the wafer and a thermal expansion layer on a back side the wafer, wherein the thermal expansion layer has a linear coefficient of thermal expansion greater than $1.0 \times 10^{-5}$ $K^{-1}$, and iteratively bonding a plurality of second semiconductor dies to a respective one of the first semiconductor dies by adjusting a temperature of the wafer by heating or cooling the thermal expansion layer to a local target temperature of a respective first semiconductor die that is bonded to a respective one of the second semiconductor dies.

According to another embodiment of the present disclosure, an apparatus for bonding dies is provided, which comprises: a chuck configured to hold a wafer including a plurality of first semiconductor dies that are not singulated; a die attachment unit configured to sequentially bond second semiconductor dies to a respective one of the first semiconductor dies; a temperature control mechanism configured to change the temperature of the wafer at least by 5 degrees during bonding of the second semiconductor dies to the first semiconductor dies; a computer configured to store a two-dimensional map of local target temperatures for each first semiconductor die in the wafer and to set a temperature of the wafer to a respective local target temperature for each first semiconductor die under bonding by controlling the temperature control mechanism.

BRIEF DESCRIPTION OF THE DRAWINGS

FIG. 1A is a vertical cross-sectional view of a wafer including a plurality of first semiconductor dies after deposition of an optional barrier layer and a metal layer according to an embodiment of the present disclosure.

FIG. 1B is a plan view of a backside of the wafer of FIG. 1A.

FIG. 4 is a flow diagram for an exemplary bonding process according to an embodiment of the present disclosure.

FIG. 6B is a top-down view of the in-process memory die of FIG. 6A.

FIG. 8 is vertical cross-sectional view of an exemplary assembly of a memory die and a support die.

DETAILED DESCRIPTION

Figure 1C:
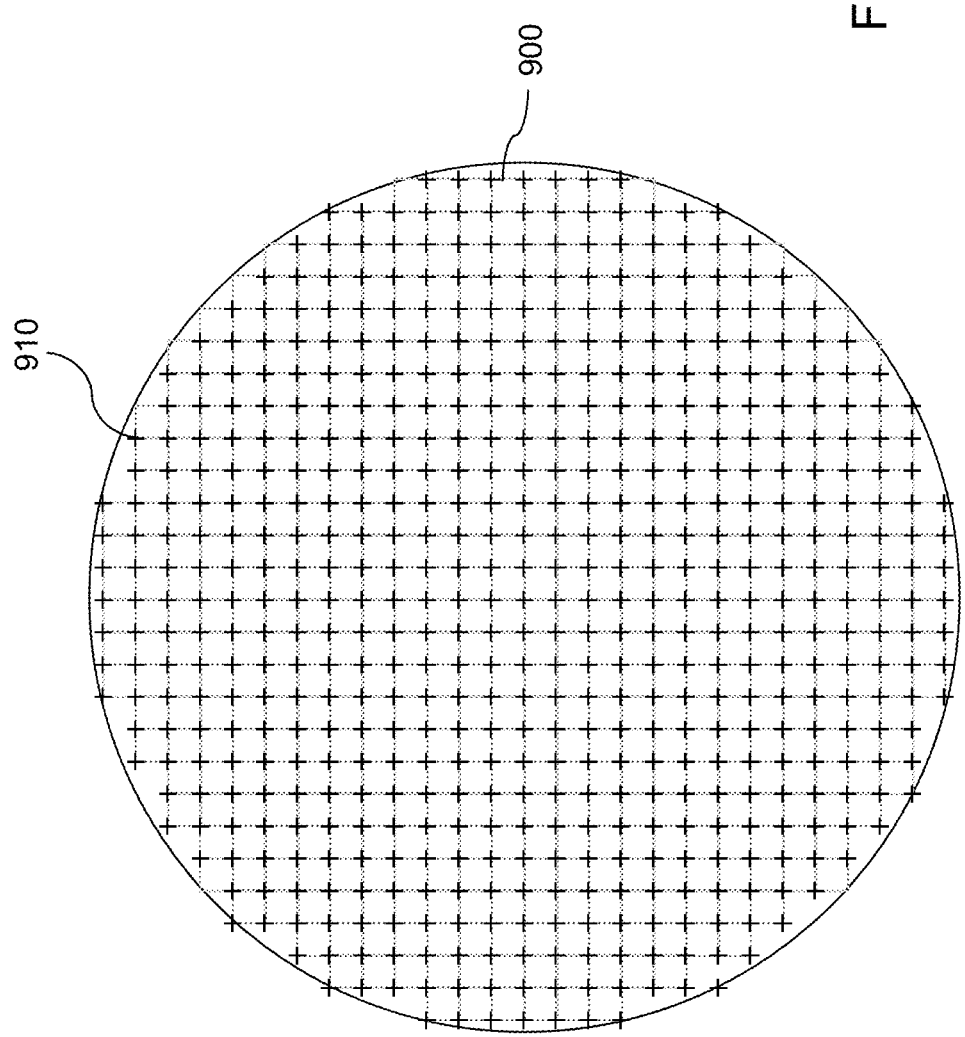
FIG. 1C is a plan view of a front side of the wafer of FIGS. 1A and 1B.

Complementary metal oxide semiconductor (CMOS) devices may be formed on a same substrate as a three-dimensional memory device. However, degradation of CMOS devices due to collateral thermal cycling and hydrogen diffusion during manufacture of the three-dimensional memory device places a constraint on performance of the support circuitry including the CMOS devices. A bonded assembly of a memory die and a support die may be used as an alternative. However, bending and warpage of the memory die due to internally-generated stress and bonding it to a relatively flatter (e.g., less warped) support die presents a challenge. Distortion of memory die and or support die due to tensile or compressive stresses may create alignment issues. Embodiments of the present disclosure provide warpage-compensation methods which utilize temperature control of the die during bonding, and providing a backside thermal expansion layer for improving yield of bonded assemblies containing a memory die and a support die, the various embodiments of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. Each plane contains a number of memory blocks (or "blocks"), which are the smallest unit that may be erased by in a single erase operation. Each memory block contains a number of pages, which are the smallest units that may be selected for programming.

Referring to FIGS. 1A-1C, a wafer 90W is illustrated, which includes a plurality of first semiconductor dies 900. The first semiconductor dies 900 may be under non-uniform mechanical stress induced during manufacturing processes, and thus, may have non-uniform distortion therein. For example, bonding pads on the first semiconductor dies 900 may be compressed or expanded laterally depending on the magnitude and the direction of the local stress in the first semiconductor dies 900.

Examples of such high stress semiconductor dies include three-dimensional memory array dies such as three-dimensional NAND array dies. In one embodiment, each first semiconductor die 900 may include a three-dimensional array of memory elements. In one embodiment, the three-dimensional array of memory elements may include a two-dimensional array of vertical NAND strings that extend through an alternating stack of insulating layers and electrically conductive layers. The mechanical stress generated by components of the first semiconductor dies 900, such as the electrically conductive layers or other metallic or dielectric components, may induce deformation of the wafer 90W. Such non-uniform mechanical distortion of the wafer 90W may cause non-uniform die areas for the first semiconductor dies 900. As a result of the deformation, warping and non-uniform size variations of the first semiconductor dies 900, bonding of second semiconductor dies to the first semiconductor dies 900 may be difficult, and may result in depressed yield.

According to an embodiment of the present disclosure, thermal expansion tailored to each individual first semiconductor die 900 may be used to enhance the bonding yield during a bonding process in which the first semiconductor dies 900 are individually bonded to second semiconductor dies. For example, the first semiconductor dies 900 may be memory dies (such as three-dimensional NAND array dies), and the second semiconductor dies may be logic dies including a peripheral circuitry configured to control the memory elements within the memory dies.

According to an embodiment of the present disclosure, the areal coefficient of thermal expansion of the wafer may be increased by depositing a thermal expansion layer having a high coefficient of thermal expansion. For example, the thermal expansion layer may be a metal layer 1010 may be deposited on the back side (e.g., on the backside surface) of the wafer 90W. Optionally, a barrier layer 1009 may be deposited on the backside surface of the wafer 90W before deposition of the metal layer 1010. The barrier layer 1009 may include a metallic barrier layer such as TiN, TaN, and WN, and may prevent diffusion of the material of the metal layer 1010 into the backside of a semiconductor layer within the wafer 90W. The thickness of the barrier layer 1009 may be in a range from 10 nm to 100 nm, although lesser and greater thicknesses may also be used.

The metal layer 1010 may include a metal having a high liner coefficient of thermal expansion. In one embodiment, the metal layer 1010 may include, and/or consist essentially of, a metal or an intermetallic alloy having a linear coefficient of thermal expansion greater than $1.0 \times 10^{-5}$ K$^{-1}$ at 20 degrees Celsius. For example, the metal layer 1010 may include, or may consist essentially of, at least one material selected from Au, Ag, Cu, and Al. The thickness of the metal layer 1010 may be in a range from 300 nm 30,000 nm, such as from 600 nm to 15,000 nm, although lesser and greater thicknesses may also be used.

In one embodiment, the metal layer 1010 may be formed as an unpatterned layer, i.e., a blanket layer, that covers an entirety of the back side (e.g., backside surface) of the wafer 90W with a uniform thickness throughout. The metal layer 1010 may remain on the backside of the wafer 90W through the die bonding process to be subsequently described.

According to an embodiment of the present disclosure, die areas of the first semiconductor dies 900 on the wafer 90W may be determined at a predetermined fixed temperature, which is herein referred to as a measurement temperature. The measurement temperature may be within 20 degrees Celsius of the ambient temperature at which the first semiconductor dies 900 are to be subsequently bonded to a respective second semiconductor die. For example, the measurement temperature may be room temperature, i.e., 20 degrees Celsius.

Generally, data including, or related to, die areas of the first semiconductor dies 900 on the wafer 90W may be generated at the measurement temperature. In one embodiment, the die areas of the first semiconductor dies 900 on the wafer 90W may be determined by measuring locations of a respective set of four alignment marks 910 for each first semiconductor die 900 in the wafer 90W. Each of the four alignment marks 910 of a first semiconductor die 900 may be located at a respective corner of a rectangle that defines the area of the first semiconductor die 900. The alignment marks 910 are physical features that may be formed by a combination of lithographic processes and pattern transfer processes, and may be used to align subsequently formed lithographic patterns to pre-existing lithographic patterns. Each alignment mark 910 may have a shape of a cross, and/or a shape of nested rectangles. Measurement of the locations of the alignment marks 910 may be performed using a metrology tool configured to measure x-y coordinates of features on a wafer. The data on the x-y coordinates of the alignment marks 910 may be transmitted to a computer.

Figure 2:
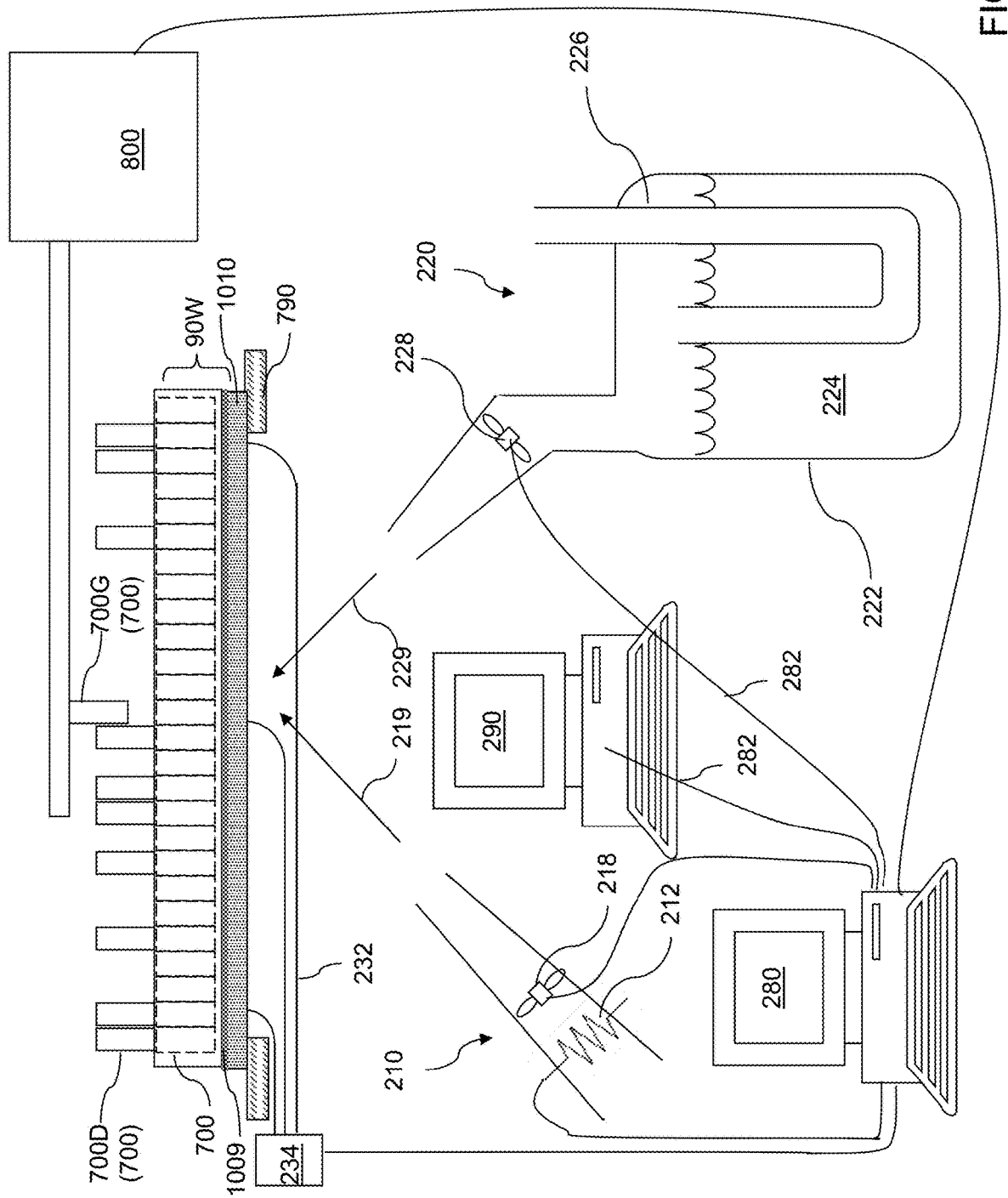
FIG. 2 is a schematic block diagram of an exemplary apparatus for bonding dies according to an embodiment of the present disclosure.

Referring to FIG. 2, a bonding apparatus for bonding the first semiconductor dies 900 in the wafer 90W to second semiconductor dies 700 is illustrated. The apparatus may include a computer 280 that may be used to calculate the die area for each of the first semiconductor dies 900 based on the measurement data on the x-y coordinates of the alignment marks 910. While the present disclosure describes an embodiment in which the computer 280 within the bonding apparatus is configured to control the temperature of the wafer 90W and is configured to provide calculations for the areas of the first semiconductor dies 900, embodiments are expressly contemplated herein in which the bonding apparatus comprises a second computer 290 dedicated to calculating the die areas of the first semiconductor dies 900 in addition to the computer 280 illustrated in FIG. 2. In such alternative embodiments, the second computer 290 may send the data on the die areas of the first semiconductor dies 900 to the computer 280 illustrated in FIG. 2.

Generally, the die area may be calculated for each of the first semiconductor dies 900 on the wafer 90W. In one embodiment, the die area may be defined as the area that is laterally enclosed by a respective set of four alignment marks 910 for each first semiconductor die 900 located at four corners of the rectangle that defines the die area of the first semiconductor die 900. A two-dimensional map of die areas may be generated by the computer 280 or in alternative embodiments using two computers, by the second computer 290.

Subsequently, the computer 280, or the second computer 290, may generate a two-dimensional map of local target temperatures. The local target temperature may be a temperature that a respective first semiconductor die 900 may be placed in order to provide a die area within a target die area range. The target die area range may be determined based on the size of the second semiconductor die 700 at the ambient temperature of the bonding process performed using the bonding apparatus of FIG. 2.

In one embodiment, a fractional deviation of each calculated die area from a target value for the die area may be calculated by an automated program that resides in the computer 280 or in the second computer 290. The automated program may subsequently determine each local target temperature by adding a ratio of a respective fractional deviation to an areal coefficient of thermal expansion of the wafer 90W to the measurement temperature. The areal coefficient of thermal expansion of the wafer 90W refers to the coefficient of expansion of the area of the wafer 90W per unit temperature change at the measurement temperature. The coefficient expansion of the area of the wafer 90W is determined by the composition of the material portions within the wafer 90W, and may be significantly affected by the presence of the metal layer 1010 at the bottom of the wafer 90W. Thus, the metal layer 1010 may increase the coefficient expansion of the area of the wafer 90W, and allows control of the die area of the first semiconductor dies 900 by changing the temperature of the wafer 90W. Thus, the local target temperatures may be estimated to thermally adjust a die area of each of the first semiconductor dies to the target die area (which is the ideal area for bonding the first semiconductor dies 900 to the second semiconductor dies 700) according to an algorithm built into the automated program residing in the computer 280 (or the second computer 290).

Generally, the bonding apparatus may be configured to bond unsingulated dies (such as the first semiconductor dies 900) within a wafer 90W to singulated dies (such as the second semiconductor dies 700). In one embodiment, the bonding apparatus may comprise a chuck 790 configured to hold a wafer 90W including a plurality of first semiconductor dies 900 that are not singulated (i.e., not diced and held together as a single contiguous structure), a die attachment unit 800 may be configured to sequentially bond second semiconductor dies 700 to a respective one of the first semiconductor dies 900; a temperature control mechanism (210, 220) configured to change the temperature of the wafer 90W at least by 5 degrees during bonding of the second semiconductor dies 700 to the first semiconductor dies 900, and a computer 280 configured to store a two-dimensional map of local target temperatures for each first semiconductor die 900 in the wafer 90W and to set a temperature of the wafer 90W to a respective local target temperature for each first semiconductor die 900 under bonding by controlling the temperature control mechanism (210, 220). The die attachment unit 800 may be any die attachment unit known in the art that is configured to attach a single die to a mating die on a wafer containing a plurality of unsignulated dies. In one embodiment, bonding of the second semiconductor dies 700 may be sequentially performed one by one, or by a preset number (such as two or three, etc.) of second semiconductor dies 700 in a cluster at a time. FIG. 2 illustrates the bonding apparatus during a bonding process. Previously bonded second semiconductor dies 700D and a second semiconductor die 700G under bonding are illustrated.

In one embodiment, the computer 280 may be preloaded with an automated program that is configured to receive an input data including, or related to, die areas of the first semiconductor dies 900 on the wafer 90W at a measurement temperature. The input data including the die areas of the first semiconductor dies 900 may be calculated by the second computer 290 and transmitted to the first computer 280 by a signal transmission element 282 (such as electrical wires or wireless signal transmission elements), or may be calculated by the computer 280 based on the input data relating to the areas of the first semiconductor dies 900 on the wafer 90W. For example, a metrology tool may measure the x-y coordinates of the alignment marks 910 on the wafer 90W and transmit the data on the x-y coordinate measurements to the computer 280. The automated program may be configured to generate the two-dimensional map of local target temperatures for each first semiconductor die 900 in the wafer 90W by calculating a local target temperature that is projected to thermally adjust a die area of each of the first semiconductor dies 900 to a target die area.

Figure 3:
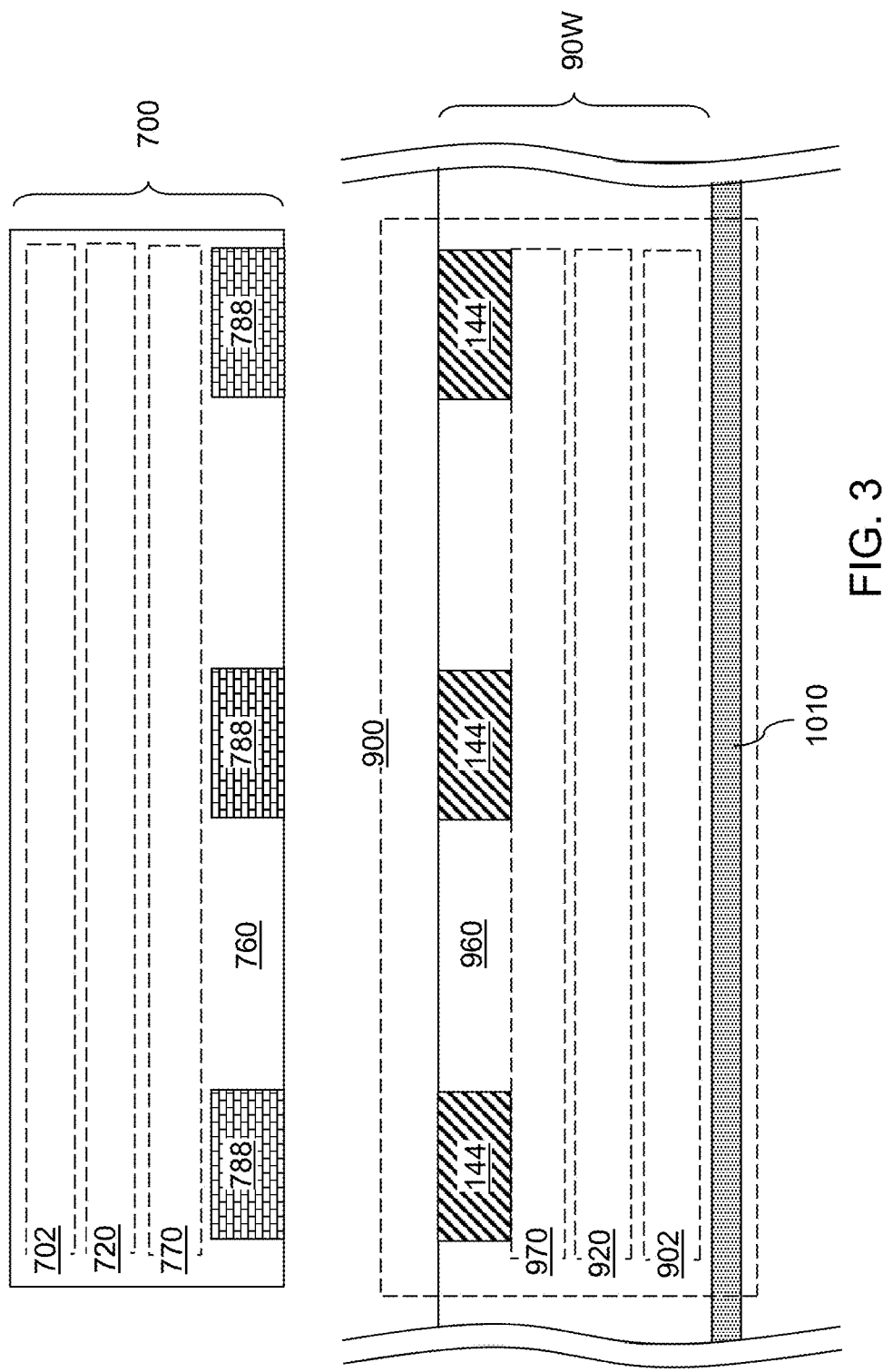
FIG. 3 is a magnified view of a mating pair of a first semiconductor die and a second semiconductor die within the exemplary apparatus of FIG. 2.

Referring to FIG. 3, the target die area may be predetermined based on the layout the first metal bonding pads 144 on the first semiconductor die 900 and the layout of the second metal bonding pads 788 on the second semiconductor die 700 under bonding. Each first semiconductor die 900 may include a first semiconductor substrate 902, first semiconductor devices 920, first metal interconnect structures 970, a first pad-level dielectric layer 960, and the first metal bonding pads 144 formed within the first pad-level dielectric layer 960. Each second semiconductor die 700 may include a second semiconductor substrate 702, second semiconductor devices 720, second metal interconnect structures 770, a second pad-level dielectric layer 760, and the second metal bonding pads 788 formed within the second pad-level dielectric layer 760.

Referring back to FIG. 2, the automated program residing in the computer 280 or the optional second computer 290 may be configured to receive data including positional deviations of alignment marks 910 from ideal positions for each first semiconductor die 900 on the wafer 90W at the measurement temperature as the input data. In one embodiment, the automated program may be configured to generate the two-dimensional map of local target temperatures by determining a fractional deviation of each calculated die area for the first semiconductor dies 900 from a target value for the die area, and by determining each local target temperature by adding a ratio of a respective fractional deviation to an areal coefficient of thermal expansion of the wafer 90W to the measurement temperature.

In one embodiment, the local target temperatures may have a granularity in a range from 0.1 degrees Celsius to 2.5 degrees Celsius. As used herein, a "granularity" refers to a minimum step among digitized quantities.

In one embodiment, the computer 280 may be configured to monotonically increase, or monotonically decrease, the temperature of the wafer 90W between success bonding steps, and to control the die attachment unit 800 to attach a respective subset of the second semiconductor dies 700 to each first semiconductor die 900 having a local target temperature that is the same as the temperature of the wafer 90W during each time period the temperature of the wafer 90W is held stationary. For example, a first subset of the second semiconductor dies 700 may be bonded to a first subset of the first semiconductor dies 900 for which the local target temperature a first temperature while the temperature of the wafer 90W is held stationary at the first temperature, then the temperature of the wafer 90W may be ramped to a second temperature, then a second subset of the second semiconductor dies 700 may be bonded to a second subset of the second semiconductor dies 700 for which the local target temperature the second temperature while the temperature of the wafer 90W is held stationary at the second temperature, and so forth.

In one embodiment, the temperature control mechanism (210, 220) may include a thermal convection heating unit 210 configured to provide a first gas flow 219 at a first temperature higher than the ambient temperature of the bonding apparatus, and a cryogenic convection cooling unit 220 configured to provide a second gas flow 229 at a second temperature lower than the ambient temperature of the bonding apparatus. The first temperature of the first gas flow 219 may be higher than the ambient temperature by a temperature differential in a range from 30 degrees to 300 degrees. The second temperature of the second gas flow 229 may be lower than the ambient temperature by a temperature differential in a range from 30 degrees to 220 degrees. The computer 280 may be configured to control the flux of the first gas flow 219 and the flux of the second gas flow 229. A temperature sensor 234 may be configured to monitor the temperature of the wafer 90W, for example, by attaching thermocouples 232 to the backside of the metal layer 1010.

In an illustrative example, the thermal convection unit 210 may include a fan 218 and a heater 212 that are configured to generate a flux of hot air or a heated ambient gas within the bonding apparatus. The cryogenic convection unit 220 may include a cryogenic tank 222 (such as a liquid nitrogen tank) containing a cryogenic liquid 224 (such a liquid nitrogen), a heat exchange mechanism 226 (such as a pipe configured to pass an ambient gas or an externally supplied gas through the cryogenic liquid 224), and a fan 228 configured to generate a flux of cold air or a cooled ambient gas within the bonding apparatus. The first gas flow 219 and the second gas flow 229 may be directed to the backside of the metal layer 1010 to induce thermal expansion or thermal contraction of the wafer 90W. The flux of the first gas flow 219 and the flux of the second gas flow 229 may be controlled by the computer through control signals transmitted from the computer 280 to the thermal convection unit 210 or the cryogenic convection unit 220 through signal transmission elements 282. While the present disclosure is described using an embodiment in which the thermal convection unit 210 or the cryogenic convection unit 220 are used for heating and cooling the wafer 90W, embodiments are expressly contemplated herein in which any other type of heating mechanisms and/or cooling mechanisms are used to heat and/or cool the wafer 90W.

In one embodiment, sequential adjustment of the temperature of the wafer 90W to the local target temperature of the respective first semiconductor die 900 may include changing the temperature of the wafer 90W by at least 5 degrees Celsius during bonding the second semiconductor dies 700 to the first semiconductor dies 900 within the wafer 90W. In one embodiment, the total temperature change for the wafer 90W during the bonding process may be in a range from 5 degrees Celsius to 100 degrees Celsius, although lesser and greater ranges may also be used.

In one embodiment, sequentially adjusting the temperature of the wafer 90W to the local target temperature of a respective first semiconductor die 900 under bonding may comprise heating the wafer by at least 2.5 degrees Celsius between bonding of a second semiconductor die 700 to a first semiconductor die 900 and bonding of another second semiconductor die 700 to another first semiconductor die 900. In one embodiment, sequentially adjusting the temperature of the wafer to the local target temperature of a respective first semiconductor die 900 under bonding may comprise cooling the wafer by at least 2.5 degrees Celsius between bonding of a second semiconductor die 700 to a first semiconductor die 900 and bonding of another second semiconductor die 700 to another first semiconductor die 900. A plurality of second semiconductor dies 700 may be sequentially and iteratively bonded to a respective one of the first semiconductor dies 900.

Referring to FIG. 4, a flow chart illustrates a general processing sequence for bonding second semiconductor dies 700 to the first semiconductor dies 900. Referring to step 410, a two-dimensional map of die areas of first semiconductor dies 900 on a wafer 90W at a measurement temperature may be generated.

Referring to step 420, a two-dimensional map of local target temperatures used to compensate for the local die area variations may be generated. A local target temperature may be calculated for each of the first semiconductor dies 900 individually based on the measured die area of the first semiconductor die 900. The two-dimensional map of local target temperatures may be a temperature map that is estimated to thermally adjust the die area of each of the first semiconductor dies 900 to a target die area that is optimal for bonding, i.e., that causes the spatial distribution of a respective set of first metal bonding pads 144 to have matching dimensions as a set of second metal bonding pads 788 in a mating second semiconductor die 700.

Referring to step 430, the wafer 90W may be loaded onto the chuck 790 to a bonding apparatus comprising at least one temperature sensor 234.

Referring to step 440, at least one unbonded first semiconductor die 900 within the wafer 90W may be selected for bonding. The at least one bonded first semiconductor die 900 has a first local target temperature, which may be a lowest local target temperature selected from the set of local target temperatures for the first semiconductor dies 900 or a highest local target temperature selected from the set of local target temperatures for the first semiconductor dies 900. A plurality of unbonded first semiconductor dies 900 having the same local target temperature may be selected.

Referring to step 450, the temperature of the wafer 90W may be changed to the local target temperature for the at least one selected first semiconductor die 900. The entire wafer 90W may be cooled or heated globally. In other words, heating or cooling of the wafer 90W occurs at the level of the entire wafer 90W.

Referring to step 460, a second semiconductor die 700 is attached to each of the at least one selected first semiconductor die 900.

Referring to determination 475, the wafer 90W is checked to determine if all of the first semiconductor dies 900 are bonded to a respective second semiconductor die 700. If all of the first semiconductor dies 900 are bonded (i.e., determination 475="yes"), the process flow proceeds to step 490, at which the bonding process terminates. If any of the first semiconductor dies 900 is not bonded (i.e., determination 475="no"), the process flow proceeds to step 440. The next set of at least one selected first semiconductor die 900 may be a set having a local target temperature that is closest to the local target temperature used in a preceding iteration of step 450.

Generally, a plurality of second semiconductor dies 700 may be sequentially and iteratively bonded to a respective one of the first semiconductor dies 900 by sequentially adjusting the temperature of the wafer 90W to a local target temperature of a respective first semiconductor die 900 that is bonded to a respective one of the second semiconductor dies 700. In one embodiment, iteratively bonding the plurality of second semiconductor dies 700 to the respective one of the first semiconductor dies 900 comprises bonding at least two first semiconductor dies 900 having a first temperature as the local target temperatures to a respective second semiconductor die 700 while maintaining the wafer 90W at the first temperature, and bonding at least two additional first semiconductor dies 900 having a second temperature as the local target temperatures to a respective additional second semiconductor die 700 while maintaining the wafer at the second temperature. The second temperature is different from the first temperature.

In one embodiment, each of the second semiconductor dies 700 may be a singulated die having a respective area that is not greater than an average area of the first semiconductor dies 900 at the measurement temperature.

In one embodiment, the first semiconductor dies 900 may comprise memory dies including a three-dimensional array of memory elements, and the second semiconductor dies 700 comprise logic dies including a peripheral circuitry configured to control an instance of the three-dimensional array of memory elements.

In one embodiment, each of the second semiconductor dies 700 may be bonded to the respective one of the first semiconductor dies 900 by metal-to-metal bonding in which each bonding interface is a metal-to-metal interface between a bonding pad of a respective second semiconductor die 700 and a bonding pad of a respective first semiconductor die 900.

Figure 5A:
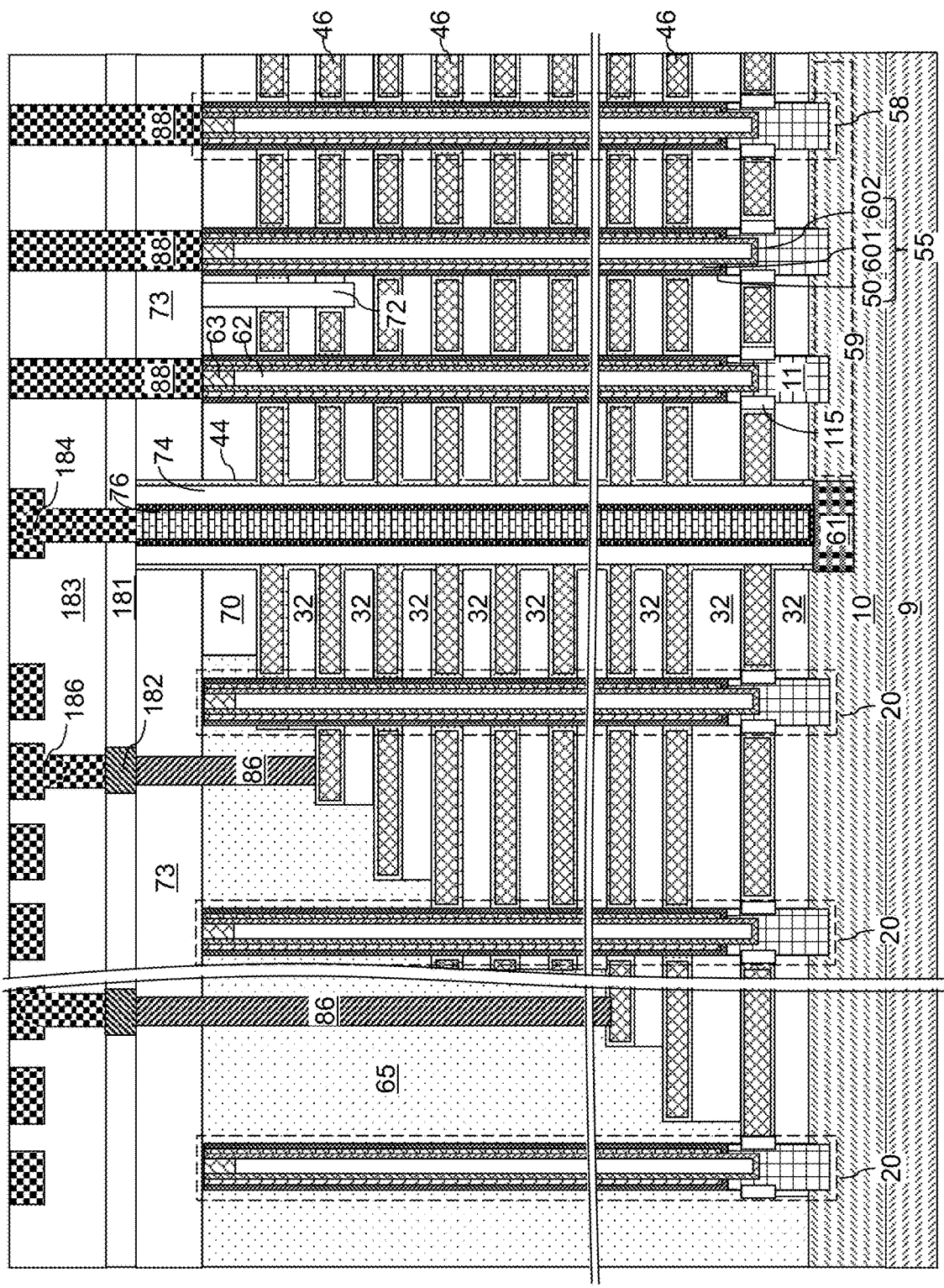
FIG. 5A is a vertical cross-sectional view of an in-process memory die after formation of contact via structures according to an embodiment of the present disclosure.
Figure 5B:
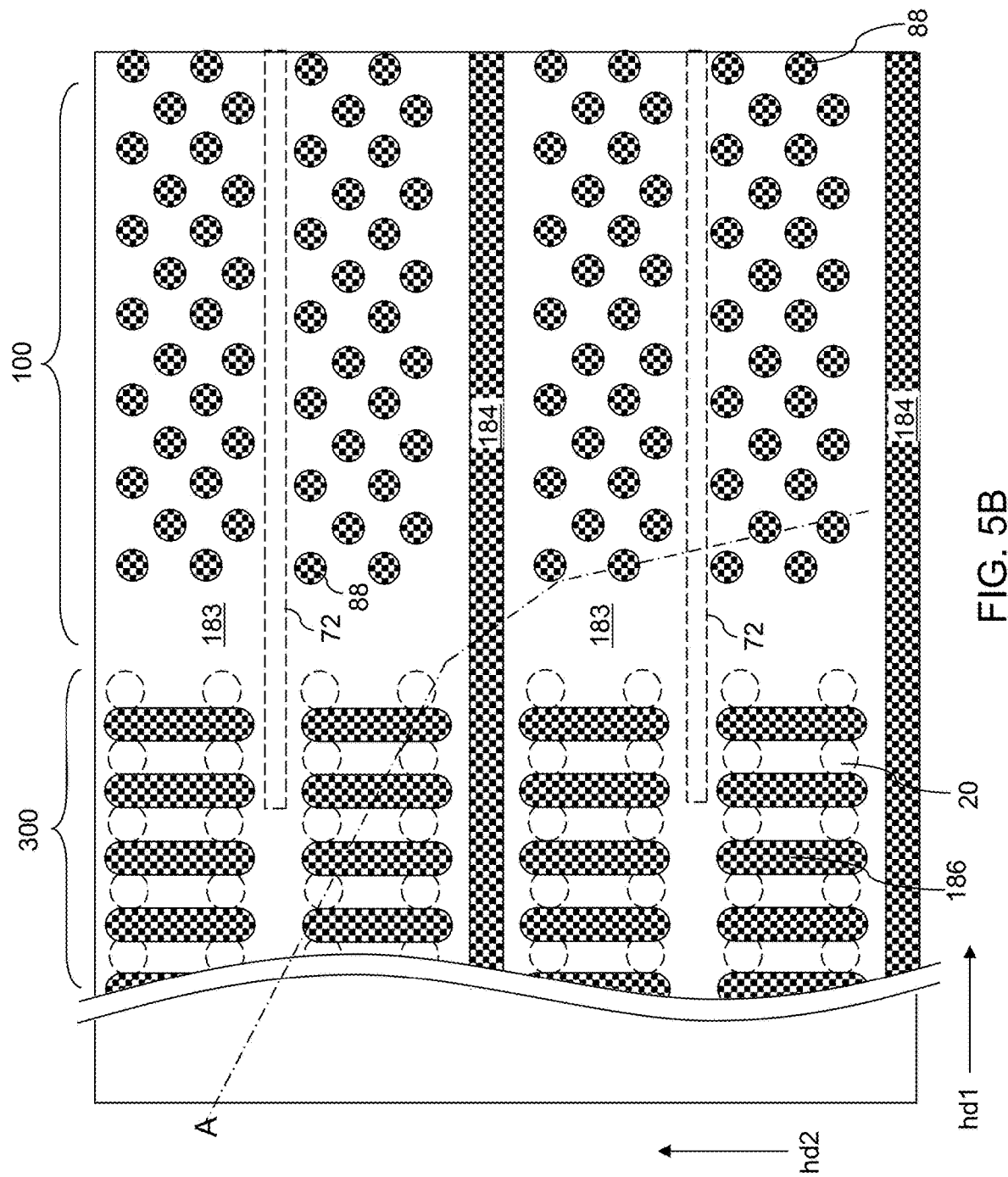
FIG. 5B is a top-down view of the in-process memory die of FIG. 5A.

FIGS. 5A and 5B illustrate an exemplary in-process memory die, which may be used to provide a first semiconductor die 900 illustrated above. The in-process memory die may be formed on a substrate including a substrate semiconductor layer 9 and an optional semiconductor material layer 10. An alternating stack of insulating layers 32 and sacrificial material layers (not shown) are formed. An insulating cap layer 70 may be formed over the alternating stack. Drain-select-level isolation structures 72 may be optionally formed through topmost layers of the alternating stack. The insulating cap layer 70 and the alternating stack (insulating layers 32 and sacrificial material layers (not shown)) may be patterned to form stepped surfaces, and a retro-stepped dielectric material portion 65 may be formed over the stepped surfaces. Memory openings may be formed through the insulating cap layer 70 and the alternating stack to a top surface of the substrate (9, 10). Support openings may be formed through the retro-stepped dielectric material portion 65 and patterned portions of the alternating stack to a top surface of the substrate (9, 10). A memory opening fill structure 58 may be formed in each memory opening in a memory region 100, and a support pillar structure 20 may be formed in each support opening in a staircase region 300. Each memory opening fill structure 58 and each support pillar structure 20 may include a pedestal channel portion 11, a memory film 50 that may include a layer stack, from outside to inside, of a blocking dielectric, a charge storage layer, and a tunneling dielectric, a vertical semiconductor channel 60 that may include a first semiconductor channel layer 601 and a second semiconductor channel layer 602, an optional dielectric core 62, and a drain region 63. A lower contact level dielectric layer 73 may be formed over the insulating cap layer 70 and the retro-stepped dielectric material portion 65. Backside trenches may be formed through the lower contact level dielectric layer 73 and the alternating stack to a top surface of the substrate (9, 10). Backside recesses may be formed by removing the sacrificial material layers. Physically exposed surfaces of the pedestal channel portions may be oxidized to form tubular dielectric spacers 115. The sacrificial material layers may be replaced with an optional backside blocking dielectric liner 44 and electrically conductive layers 46 that include word lines. Portions of the charge storage layer that are surrounded by the word lines constitute memory elements, which may be arranged as a three-dimensional array memory elements. A source region 61 may be formed at the bottom of each backside trench. A horizontal semiconductor channel 59 may be formed between each source region 61 and a neighboring group of pedestal channel portions 11 in the memory openings. An insulating spacer 74 and a source contact structure 76 may be formed in each backside trench. The set of all semiconductor devices located below the top surface of the lower contact level dielectric layer 73 correspond to the first semiconductor devices 920 described above.

Layer contact via structures 86 including word line contact via structures may be formed on each electrically conductive layer 46. A middle contact level dielectric layer 181 may be deposited over the lower contact level dielectric layer 73. Contact-connection line structures 182 may be formed on top of the layer contact via structures 181 in the middle contact level dielectric layer. An upper contact level dielectric layer 183 may be formed over the middle contact level dielectric layer 181. Contact via cavities may be formed through the upper contact level dielectric layer 183, optionally through the middle contact level dielectric layer 181, and optionally through the lower contact level dielectric layer 73, for example, by a combination of a lithographic patterning process and an anisotropic etch process. Optionally, a line pattern may be formed in an upper region of a subset of the contact via cavities. Various contact via structures (88, 184, 186) may be formed through the upper contact level dielectric layer 183, the middle contact level dielectric layer 181, and the lower contact level dielectric layer 73. The contact via structures (88, 184, 186) may include drain contact via structures 88 that contact drain regions 63, word-line-connection contact via structures 186 that are formed on a top surface of a respective one of the contact-connection line structures 182, and source-connection contact via structures 184 that are formed on a top surface of a respective one of the source contact structures 76.

Figure 6A:
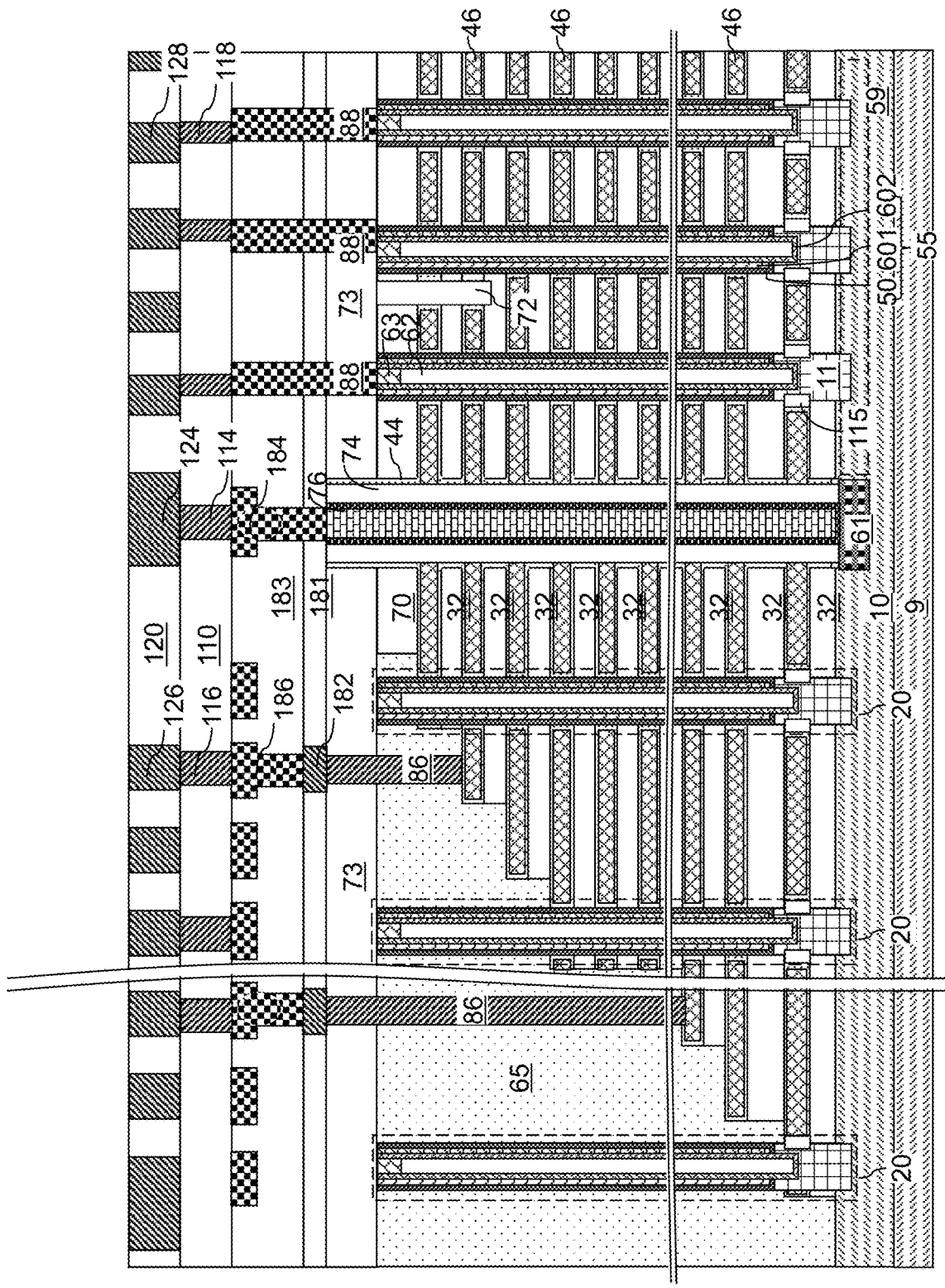
FIG. 6A is a vertical cross-sectional view of the in-process memory die after formation of bit line level structures according to an embodiment of the present disclosure.

Referring to FIGS. 6A and 6B, a first via level dielectric layer 110 may be deposited over the upper contact level dielectric layer 183. Various first via structures (118, 114, 116) may be formed in the first via level dielectric layer 110. The first via structures (118, 114, 116) may include bit-line-connection via structures 118 that are formed on a top surface of a respective one of the drain contact via structures 88, first source-connection via structures 114 that are formed on a top surface of a respective one of the source-connection contact via structures 184, and first word-line-connection via structures 116 that are formed on a top surface of a respective one of the word-line-connection contact via structures 186.

A first line level dielectric layer 120 may be deposited over the first via level dielectric layer 110. Various first line structures (128, 124, 126) may be formed in the first line level dielectric layer 120. The first line structures (128, 124, 126) may include bit lines 128 that are formed on a top surface of a respective one of the bit-line-connection via structures 118, first source-connection line structures 124 that are formed on a top surface of a respective one of the first source-connection via structures 114, and first word-line-connection line structures 126 that are formed on a top surface of a respective one of the first word-line-connection via structures 116.

Figure 7A:
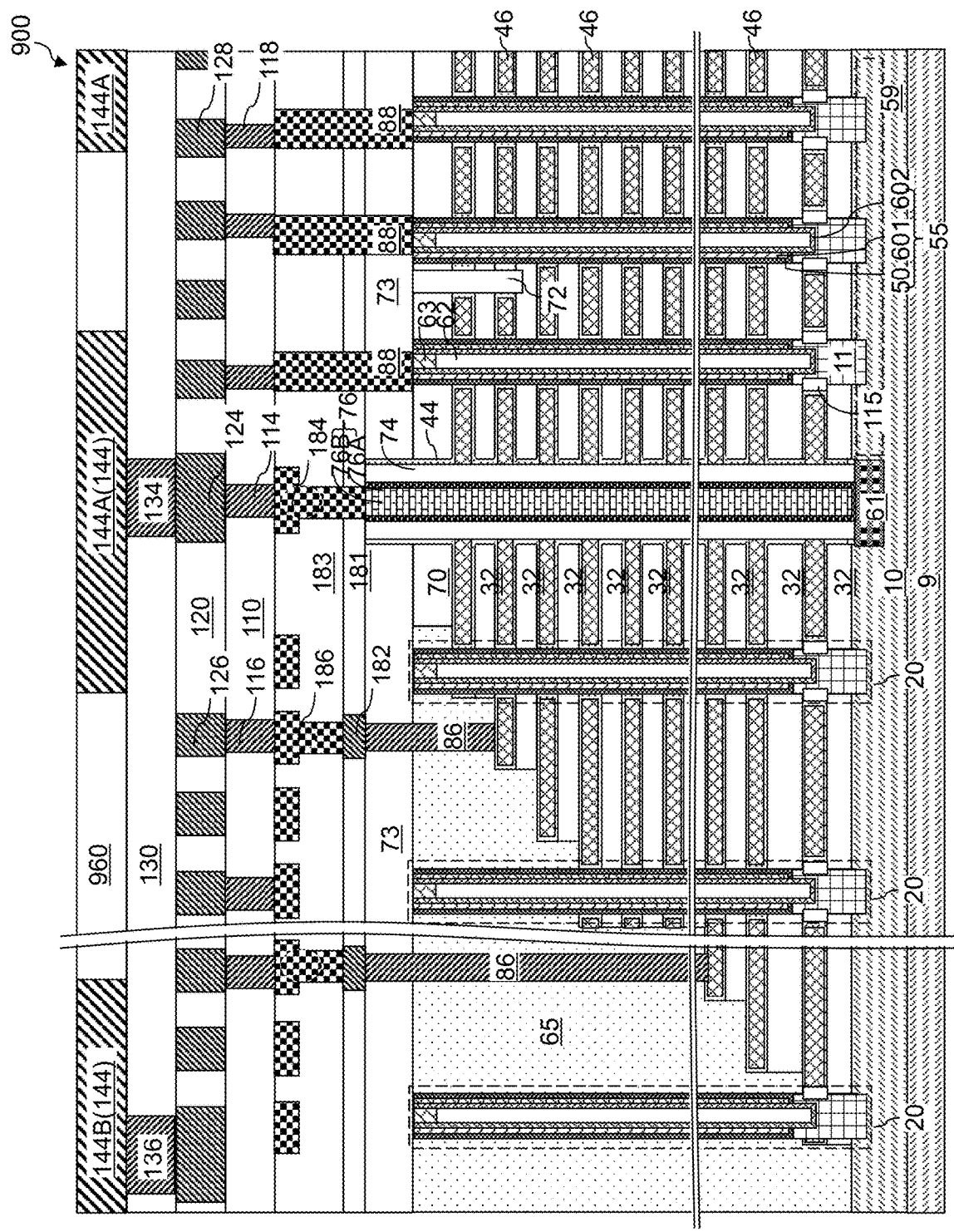
FIG. 7A is a vertical cross-sectional view of a memory die after formation of first metal bonding pads according to an embodiment of the present disclosure.
Figure 7B:
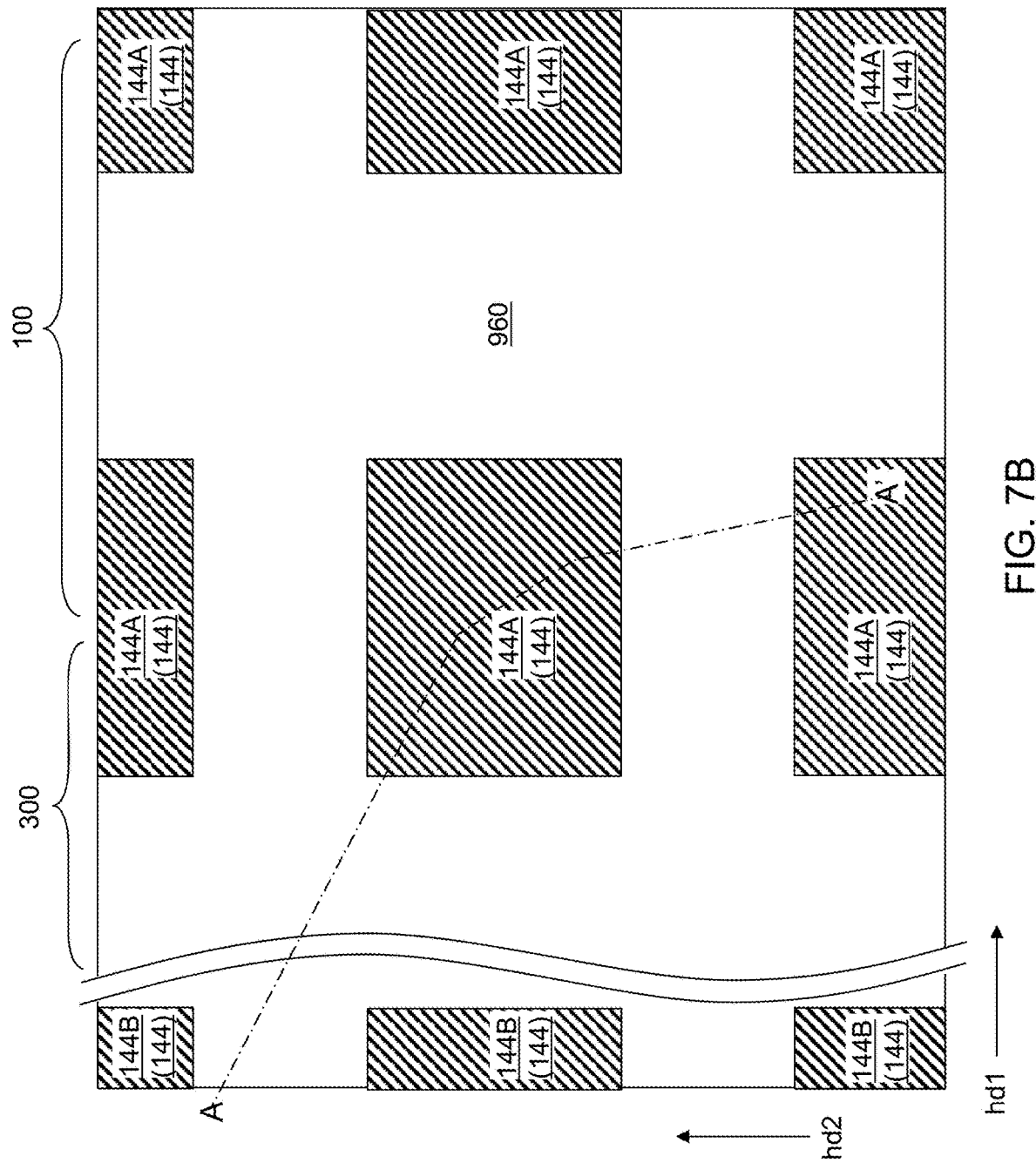
FIG. 7B is a top-down view of a region of the memory die of FIG. 7A.
Figure 7C:
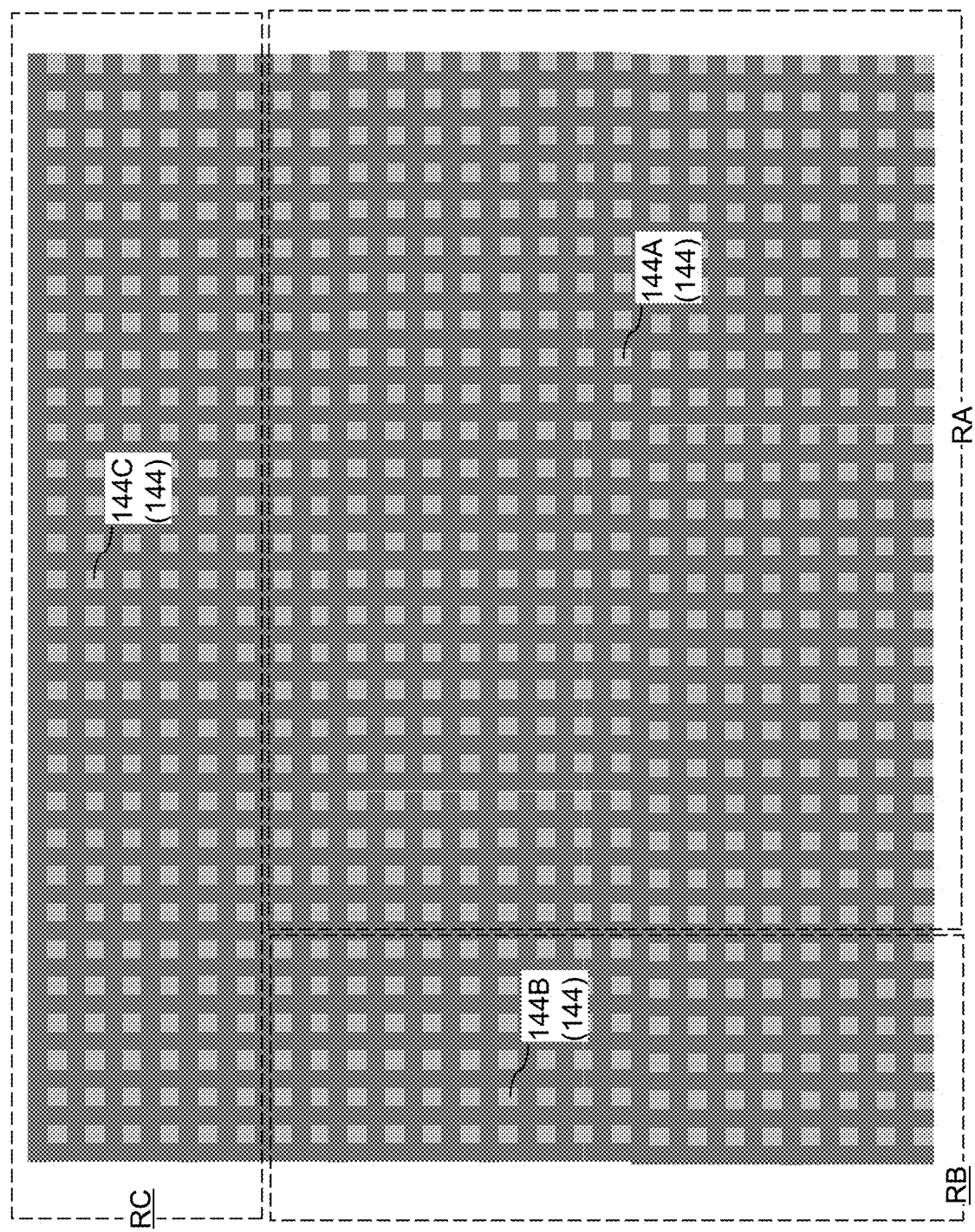
FIG. 7C is a top-down view of the memory die of FIG. 7A.

Referring to FIGS. 7A-7C, a second via level dielectric layer 130 may be deposited over the upper contact level dielectric layer 183. Second via structures (134, 136). The second via structures (134, 136) may include second source-connection via structures 134 that are formed on a respective one of the first source-connection line structures 124, second word-line-connection via structures 136 that are formed on a respective one of the word-line-connection line structures 126, and bit-line-connection via structures (not shown) that are formed on a top surface of a respective one of the bit lines 128. The set of all metal interconnect structures located within, or below, the second via level dielectric layer 130 corresponds the first metal interconnect structures 970 described above.

A first pad-level dielectric layer 960 may be formed over the second via level dielectric layer 130. First metal bonding pads 144 may be formed using the methods described above. The first metal bonding pads 144 may include source-network first metal bonding pads 144A located in region RA, word-line-connection first metal bonding pads 144B located in region RB, bit-line-connection first metal bonding pads 144C located in region RC, and additional first metal bonding pads for transmitting or receiving power or signals between the memory die (which may be used as a first semiconductor die 900) and a support die to be subsequently bonded to the memory die. The first metal bonding pads 144 may be spaced away from one another in both a first horizontal direction hd1 and a second horizontal direction hd2.

Referring to FIG. 8, a portion of a bonded structure including a first semiconductor die 900 and a second semiconductor die 700 is illustrated. The bonded structure may be formed using the methods described above.

In an illustrative example, each second semiconductor die 700 may include a support-die substrate 708, which may be a semiconductor substrate. The support-die substrate 708 may include a substrate semiconductor layer 709. Shallow trench isolation structures 722 may be provided in a surface region of the substrate semiconductor layer 709 to provide electrical isolation from semiconductor devices 710 of the peripheral circuit. The various semiconductor devices 710 may include field effect transistors, which include respective transistor active regions 742 (i.e., source regions and drain regions), a channel 746, and a gate structure 750. The field effect transistors may be arranged in a CMOS configuration. Each gate structure 750 may include, for example, a gate dielectric 752, a gate electrode 754, a dielectric gate spacer 756 and a gate cap dielectric 758. For example, the semiconductor devices 710 may include word line drivers for electrically biasing word lines of the first semiconductor die 900, which may comprise the electrically conductive layers 46, and source power supply field effect transistors that generate power to be supplied to the source regions 61 in the first semiconductor die 900.

Dielectric material layers may be formed over the semiconductor devices 710, which are herein referred to as interconnect-level dielectric layers 764. Optionally, a dielectric liner 762 (such as a silicon nitride liner) may be formed to apply mechanical stress to the various field effect transistors and/or to prevent diffusion of hydrogen or impurities from the interconnect-level dielectric layers 760 into the semiconductor devices 710. Second metal interconnect structures 770 are formed within the interconnect-level dielectric layers 764. The second metal interconnect structures 770 may include various device contact via structures 782 (e.g., source and drain electrodes which contact the respective source and drain nodes of the device or gate electrode contacts), interconnect-level metal line structures 784, and interconnect-level metal via structures 786. A second pad-level dielectric layer 760 is formed on the interconnect-level dielectric layers 764. Second metal bonding pads 788 are formed in the second pad-level dielectric layer 760 as described above. The second metal bonding pads 788 are configured to mate with the first metal bonding pads 144 to provide electrically conductive paths between the first semiconductor die 900 and the second semiconductor die 700.

The second metal bonding pads 788 of the second semiconductor die 700 are bonded to the first metal bonding pads 144 of the first semiconductor die 900 using the method described above. In one embodiment, the first semiconductor dies 900 in the first wafer and the second semiconductor dies 700 in the second wafer may be bonded to each other by metal-to-metal bonding. For example, metal-to-metal bonding between an array of second metal bonding pads 788 and the array of first metal bonding pads 144 may be induced, for example, by a thermal anneal performed at an elevated temperature.

The substrate semiconductor layer 709 may be thinned after bonding the second wafer to the first wafer, for example, by grinding. The thickness of the substrate semiconductor wafer 709 may be in a range from 5 microns to 60 microns. A backside insulating layer 714 may be formed on the back side (e.g. a backside surface) of thinned substrate semiconductor layer 709. Laterally-insulated through-substrate via structures (711, 712) may be formed through the support-die substrate 708 to provide electrical contact to various input nodes and output nodes of the first and second periphery circuitries. Each laterally-insulated through-substrate via structure (711, 712) includes a through-substrate conductive via structure 712 and a tubular insulating liner 711 that laterally surrounds the through-substrate conductive via structure 712. Logic-side external bonding pads 716 may be formed on surface portions of the laterally-insulated through-substrate via structures (711, 712). The bonded assembly of the first wafer and the second wafer may be subsequently diced to provide multiple bonded chips, which are memory chips including a respective bonded assembly of a memory die and a support die.

The methods of the present disclosure facilitate bonding between first semiconductor dies 900 in a wafer and second semiconductor dies 700 in singulated forms. The lateral dimensions of the first semiconductor dies 900 may be individually adjusted so that each first semiconductor die 900 to be bonded with a second semiconductor die 700 provides bonding pads having matching lateral dimensions as the bonding pads on the second semiconductor die 700. The deformation of the first semiconductor dies 900 due to local variations in stress may be accommodated by adjusting the dimensions of the first semiconductor dies 900 die by die. Consequently, overall device yield may be improved.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a bonded structure, comprising:
determining die areas of first semiconductor dies on a wafer at a measurement temperature;
generating a two-dimensional map of local target temperatures that are estimated to thermally adjust a die area of each of the first semiconductor dies to a target die area;
loading the wafer to a bonding apparatus comprising at least one temperature sensor; and
iteratively bonding a plurality of second semiconductor dies to a respective one of the first semiconductor dies by sequentially adjusting a temperature of the wafer to a local target temperature of a respective first semiconductor die that is bonded to a respective one of the second semiconductor dies.

2. The method of claim 1, further comprising forming a metal layer on a back side of the wafer before determining the die areas on the wafer, wherein the metal layer has a linear coefficient of thermal expansion greater than $1.0\times10^{-5}$ $K^{-1}$ at 20 degrees Celsius and has a thickness greater than 300 nm.

3. The method of claim 2, wherein the metal layer is an unpatterned layer that covers an entirety of the back side of the wafer during the iterative bonding of the plurality of second semiconductor dies to the respective one of the first semiconductor dies.

4. The method of claim 2, wherein the metal layer comprises a material selected from Au, Ag, Cu, and Al.

5. The method of claim 1, wherein determining the die areas of the first semiconductor dies comprises:
measuring locations of a respective set of four alignment marks for each first semiconductor die in the wafer; and
calculating a die area laterally enclosed by the respective set of four alignment marks for each first semiconductor die.

6. The method of claim 5, wherein generating the two-dimensional map of local target temperatures comprises:
determining a fractional deviation of each calculated die area from a target value for the die area; and
determining each local target temperature by adding a ratio of a respective fractional deviation to an areal coefficient of thermal expansion of the wafer to the measurement temperature.

7. The method of claim 1, wherein sequentially adjusting the temperature of the wafer to the local target temperature of the respective first semiconductor die comprises changing a temperature of the wafer by at least 5 degrees Celsius during bonding the second semiconductor dies to the first semiconductor dies within the wafer.

8. The method of claim 1, wherein sequentially adjusting the temperature of the wafer to the local target temperature of the respective first semiconductor die comprises heating the wafer by at least 2.5 degrees Celsius between bonding of a second semiconductor die to a first semiconductor die and bonding of another second semiconductor die to another first semiconductor die.

9. The method of claim 1, wherein sequentially adjusting the temperature of the wafer to the local target temperature of the respective first semiconductor die comprises cooling the wafer by at least 2.5 degrees Celsius between bonding of a second semiconductor die to a first semiconductor die and bonding of another second semiconductor die to another first semiconductor die.

10. The method of claim 1, wherein iteratively bonding the plurality of second semiconductor dies to the respective one of the first semiconductor dies comprises:
bonding at least two first semiconductor dies having a first temperature as the local target temperatures to a respective second semiconductor die while maintaining the wafer at the first temperature; and
bonding at least two additional first semiconductor dies having a second temperature as the local target temperatures to a respective additional second semiconductor die while maintaining the wafer at the second temperature, wherein the second temperature is different from the first temperature.

11. The method of claim 1, wherein each of the second semiconductor dies is a singulated die having a respective area that is not greater than an average area of the first semiconductor dies at the measurement temperature.

12. The method of claim 1, wherein:
the first semiconductor dies comprise memory dies including a three-dimensional array of memory elements; and
the second semiconductor dies comprise logic dies including a peripheral circuitry configured to control an instance of the three-dimensional array of memory elements.

13. The method of claim 1, wherein each of the second semiconductor dies is bonded to the respective one of the first semiconductor dies by metal-to-metal bonding in which each bonding interface is a metal-to-metal interface between a bonding pad of a respective second semiconductor die and a bonding pad of a respective first semiconductor die.

14. A method of forming a bonded structure, comprising:
providing a wafer containing first semiconductor dies on a front side of the wafer and a thermal expansion layer on a back side the wafer, wherein the thermal expansion layer has a linear coefficient of thermal expansion greater than $1.0\times10^{-5}$ $K^{-1}$; and
iteratively bonding a plurality of second semiconductor dies to a respective one of the first semiconductor dies by adjusting a temperature of the wafer by heating or cooling the thermal expansion layer to a local target temperature of a respective first semiconductor die that is bonded to a respective one of the second semiconductor dies.

15. The method of claim 14, wherein:
the thermal expansion layer comprises a metal selected from Au, Ag, Cu, and Al;
the thermal expansion layer has a thickness greater than 300 nm; and
the thermal expansion layer is an unpatterned layer that covers an entirety of the back side wafer during the iterative bonding of the plurality of second semiconductor dies to the respective one of the first semiconductor dies.

16. An apparatus for bonding dies, comprising:
a chuck configured to hold a wafer including a plurality of first semiconductor dies that are not singulated;
a die attachment unit configured to sequentially bond second semiconductor dies to a respective one of the first semiconductor dies;
a temperature control mechanism configured to change the temperature of the wafer at least by 5 degrees during bonding of the second semiconductor dies to the first semiconductor dies; and
a computer configured to store a two-dimensional map of local target temperatures for each first semiconductor die in the wafer and to set a temperature of the wafer to a respective local target temperature for each first semiconductor die under bonding by controlling the temperature control mechanism.

17. The apparatus of claim 16, wherein the computer is preloaded with an automated program that is configured to:
receive an input data including, or related to, die areas of the first semiconductor dies on the wafer at a measurement temperature; and
generate the two-dimensional map of local target temperatures for each first semiconductor die in the wafer by calculating a local target temperature that is projected to thermally adjust a die area of each of the first semiconductor dies to a target die area.

18. The apparatus of claim 17, wherein:
the automated program is configured to receive data including positional deviations of alignment marks from ideal positions for each first semiconductor die on the wafer at the measurement temperature as the input data; and the automated program is configured to generate the two-dimensional map of local target temperatures by:
determining a fractional deviation of each calculated die area from a target value for the die area; and
determining each local target temperature by adding a ratio of a respective fractional deviation to an areal coefficient of thermal expansion of the wafer to the measurement temperature.

19. The apparatus of claim 16, wherein the computer is configured to:
monotonically increase, or monotonically decrease, the temperature of the wafer between success bonding steps; and
control the die attachment unit to attach a respective subset of the second semiconductor dies to each first semiconductor die having a local target temperature that is the same as the temperature of the wafer during each time period the temperature of the wafer is held stationary.

20. The apparatus of claim 16, wherein the temperature control mechanism comprises:
a thermal convection unit configured to provide a first gas flow at a first temperature higher than an ambient temperature of the apparatus; and
a cryogenic convention unit configured to provide a second gas flow at a second temperature lower than the ambient temperature of the apparatus,
wherein the computer is configured to control a flux of the first gas flow and a flux of the second gas flow.

* * * * *